(12) United States Patent
Golat et al.

(10) Patent No.: US 11,277,109 B1
(45) Date of Patent: Mar. 15, 2022

(54) DISABLED INPUT SWITCH FOR LNA INPUT ATTENUATION

(71) Applicant: pSemi Corporation, San Diego, CA (US)

(72) Inventors: Joseph Golat, Crystal Lake, IL (US); David Kovac, Arlington Heights, IL (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/171,860

(22) Filed: Feb. 9, 2021

(51) Int. Cl.
*H03G 3/30* (2006.01)
*H03F 3/19* (2006.01)
*H03F 1/56* (2006.01)
*H04B 1/16* (2006.01)

(52) U.S. Cl.
CPC ............ *H03G 3/3036* (2013.01); *H03F 1/56* (2013.01); *H03F 3/19* (2013.01); *H04B 1/16* (2013.01); *H03F 2200/294* (2013.01); *H03F 2200/451* (2013.01); *H03G 2201/103* (2013.01); *H03G 2201/307* (2013.01)

(58) Field of Classification Search
CPC .......... H03G 3/3036; H03G 2201/103; H03G 2201/307; H03F 1/56; H03F 3/19; H03F 2200/294; H03F 2200/451; H04B 1/16
See application file for complete search history.

(56) References Cited

U.S. PATENT DOCUMENTS

| | | | |
|---|---|---|---|
| 9,602,098 B2 | 3/2017 | Prevost | |
| 10,291,223 B2 | 5/2019 | Prevost | |
| 2014/0113573 A1* | 4/2014 | Khatri | H03F 1/223 |
| | | | 455/78 |
| 2017/0070252 A1* | 3/2017 | Fong | H03D 7/1491 |
| 2019/0363690 A1* | 11/2019 | Golat | H03G 1/0088 |
| 2021/0091730 A1* | 3/2021 | Anderson | H03F 1/32 |

* cited by examiner

*Primary Examiner* — Nguyen T Vo
(74) *Attorney, Agent, or Firm* — Steinfl + Bruno LLP

(57) ABSTRACT

Methods and devices to improve the insertion loss at the LNA input of RF receivers are disclosed. The described methods and devices make use of the band switches in OFF state to improve the layout design, insertion loss and NF. Exemplary embodiments incorporating the disclosed concept are also presented.

16 Claims, 6 Drawing Sheets

200A

DISABLED INPUT SWITCH FOR LNA INPUT ATTENUATION

INCORPORATION BY REFERENCE

The present application may be related to U.S. Pat. No. 9,602,098 filed on Jul. 28, 2015, which is incorporated herein by reference in its entirety

FIELD

The present disclosure is related to radio frequency (RF) circuits including low noise amplifiers (LNA), more in particular to methods and devices to use disabled input switches to reduce insertion loss at the LNA input.

BACKGROUND

Generally, wireless systems need to support reception of signals over a very large power range. For example, the 3GPP standard defines an in-band power range of about 100 dB for cellular systems.

In order to receive such a large range of signal power levels, automatic gain control (AGC) is implemented at various points in a receiver. Maximum gain is used when the signal is small to improve noise figure (NF) and signal reception, while minimum gain is used when the signal is large to prevent clipping of the signal in the receive chain. In other words, the purpose of using AGC is to maintain a suitable signal amplitude at the RF receiver output, despite variation of the signal amplitude at the input of the RF receiver. As part of an overall RF receiver design, it is highly desired to minimize the impact of implementing the AGC on the NF while maintaining a required linearity performance of the RF receiver.

In a typical RF receiver front end, the AGC design involves the use of attenuators implemented at the input and/or the output of the LNA. The attenuators at the output of the LNA have minimal impact on the NF or the linearity of the LNA. As such, the output attenuators are mostly used when the input signal amplitude is small and there is a need to maintain the required NF. On the other hand, the NF of an LNA is sensitive to the insertion loss (IL) in front of the LNA. When the signal is large, linearity may be negatively impacted, and a linearity improvement is desired. This is the reason why the input AGC is mostly used when the input signal amplitude is large. This may come with the disadvantage of degrading the NF which can be handled because in the case of input signals with large amplitudes, increased NF levels are rather acceptable.

FIG. 1 shows a schematic diagram of a prior art RF receiver (100) including switching block (110), LNA (120) and output AGC (130). RF receiver (100) is a multiband receiver that can be configured to receive input signals from inputs (in1, in2, in3), depending upon which RF band has been selected. In a typical receiver as shown, a set of bandpass filters (not shown) in series with an RF switch exist at the input of the LNA and are used to select a specific band to be routed through switching block (110) to LNA (120). Switching block (110) has typically two main functionalities which are that of AGC and switching cellular bands.

With continued reference to FIG. 1, RF receiver (100) can operate in a high gain mode and a low gain mode. As an example, if the input signal is selected to be received from input (in1) and if the RF receiver (100) is in high gain mode, switches (S1/S"1) are closed/open to route the signal through input (in1) to LNA (120), switches (S2, S3) are open and switches (S"2, S"3) are closed to isolate the receiver from any possible signal at inputs (in2, in3). Additionally switches (S'1, S'2, S'3, S4) are open to remove attenuator (atten) from the signal path as the receiver is in a high gain mode.

Continuing with the same example as above, when RF receiver (100) is in low gain mode, switches (S'1, S4) will be closed, switch (S1) will be open, and all other switches will be in the same state as described above. As a result, attenuator (atten) will be inserted serially with the LNA input in the signal path, thus providing attenuation for the input signal (in1) in the low gain mode.

SUMMARY

For an overall improved performance of RF receiver (100), lower insertion loss and therefore a higher NF is desired. Referring back to FIG. 1, in order to a) reduce the layout design complexity, b) save space on the chip and also c) improve the insertion loss and therefore the NF, it is highly desired to design switch block (110) with the smallest possible number of switches, while maintaining the proper functionalities of switch block (110) as described above. It is also desired to use switches with smaller size whenever possible. All this is often challenging given stringent and usually conflicting requirements of the RF receivers.

The disclosed methods and devices provide practical solutions to the above-mentioned design challenges.

According to a first aspect of the disclosure, a multiband radio frequency (RF) receiver circuit is provided, comprising: a switching block comprising a plurality of switching arrangements, each switching arrangement corresponding to a selected RF band for the multiband RF receiver circuit and being individually selectable to receive an input signal in the selected RF band, and a low noise amplifier (LNA) coupled to the switching block, each switching arrangement comprising: an input terminal configured to receive the input signal in the selected RF band; a series switch configured to selectively couple the input signal at the input terminal to the LNA; a shunt switch configured to selectively couple the input terminal to a reference voltage when the switching arrangement is not selected, to isolate the input signal from the LNA; wherein, i) when the switching arrangement is selected to couple the input signal in the selected RF band to the LNA, the shunt switch is in an OFF state to decouple the input signal from the reference voltage and: in a first gain mode the series switch is in an OFF state to attenuate the input signal while coupling the input signal to the LNA through an OFF impedance of the series switch, and in a second gain mode the series switch in an ON state to couple the input signal to the LNA through an ON impedance of the series switch; and ii) when the switching arrangement is not selected, the series switch is in the OFF state and the shunt switch is in the ON state.

According to a second aspect of the disclosure, a multi-band switching block for routing a radio frequency (RF) signal to a low noise amplifier (LNA) is provided, comprising: a plurality of switching arrangements, each switching arrangement corresponding to a selected RF band and being individually selectable to receive an input signal in the selected RF band, each switching arrangement comprising: an input terminal configured to receive the input signal in the selected RF band; a series switch configured to selectively couple the input signal at the input terminal to the LNA; a shunt switch configured to selectively couple the input terminal to a reference voltage or ground when the switching arrangement is not selected, to isolate the input signal from the LNA; wherein, i) when the switching arrangement is selected to couple the input signal in the selected RF band to the LNA, the shunt switch is in an OFF state to decouple the input signal from the reference voltage or ground and: in a first gain mode the series switch is in an OFF state to attenuate the input signal while coupling the input signal to the LNA through an OFF impedance of the series switch, and in a second gain mode the series switch in an ON state to couple the input signal to the LNA through an ON impedance of the series switch; and ii) when the switching arrangement is not selected, the series switch is in the OFF state and the shunt switch is in the ON state.

According to a third aspect of the disclosure, a method of selectively coupling/decoupling a radio frequency (RF) signal to/from a low noise amplifier (LNA) through a series switch, is disclosed, the method comprising: in a coupling stage: in a first gain mode, setting the series switch in an OFF state and coupling the RF signal to the LNA through an OFF impedance of the series switch, and in a second gain mode, setting the series switch in an ON state and coupling the RF signal to the LNA through an ON impedance of the series switch; and in a decoupling stage: in a third gain mode, setting the series switch in the OFF state and shunting the RF signal to ground.

Further aspects of the disclosure are provided in the description, drawings and claims of the present application.

DETAILED DESCRIPTION

Figure 2A:
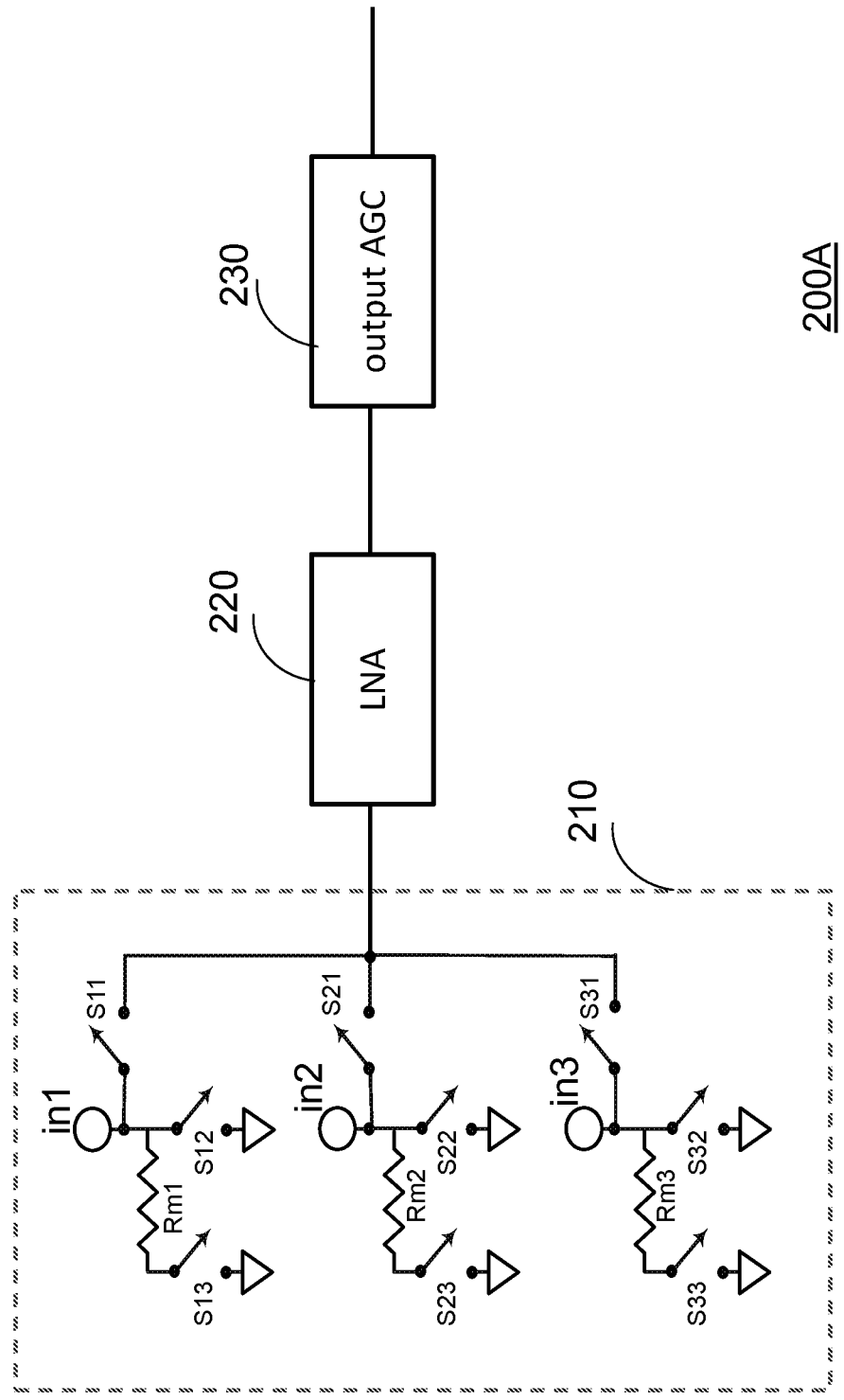
FIG. 2A shows an exemplary RF receiver according to an embodiment of the present disclosure.

FIG. 2A shows an exemplary RF receiver (200A) according to an embodiment of the present disclosure. RF receiver (200A) comprises switching block (210), LNA (220) and output AGC (230). Switching block (210) has typically two main functionalities which are that of AGC and switching cellular bands. Depending on which cellular band is selected, LNA (220) may receive an input signal from one of the inputs (in1, in2, in3). Output AGC (230) is optional and the disclosed concepts can apply to RF receivers implemented with or without output AGCs. While three inputs are shown in this disclosure, the concept can be applied to any number of inputs.

Figure 1:
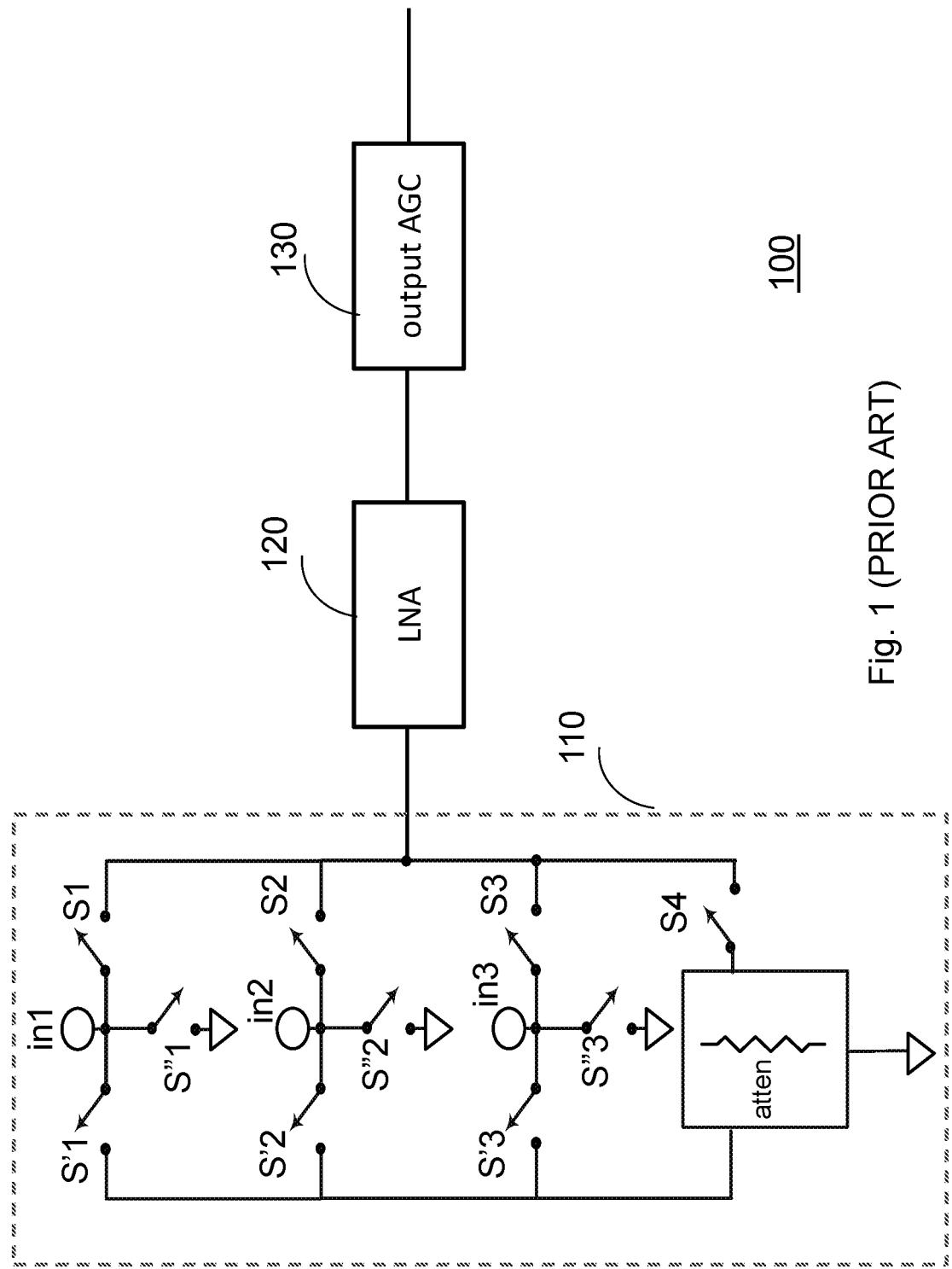
FIG. 1 shows a prior art RF receiver.

A set of bandpass filters (not shown) in series with switching block (210) may be implemented. Such filters may be used to select a specific band to be routed through switching block (210) to LNA (220) as already previously described with reference to FIG. 1.

With continued reference to FIG. 2A, receiver (200A) may operate in a high gain mode (for input signals with smaller amplitude) or a low gain mode (for input signals with larger amplitude). Switches (S11, S21, S31) are used to couple/decouple the signals at respective inputs (in1, in2, in3) to/from the input of LNA (220). Switches (S12, S22, S32) are shunt switches used to shunt corresponding inputs (in1, in2, in3) to a reference voltage or ground for further isolation, when the corresponding inputs are not selected.

As an example, if the input signal is selected to be received from input (in1) and if the RF receiver (200A) is in low gain mode, switches (S11, S12, S21, S31) are open (OFF state), and switches (S22, S32) are closed (ON state). As such, inputs (in2, in3) are decoupled from the input of LNA (220) while, on the other hand, the RF signal at input (in1) is routed, through switch (S11), to the input of LNA (220). The person skilled in the art will appreciate that, in such low gain mode where additional attenuation of the input signal is desired and differently from what shown in the prior art representation of FIG. 1, the RF input signal at input (in1) passes through switch (S11) while experiencing an attenuation due to switch (S11) being in OFF state. In other words, the attenuation of the input signal is performed through the equivalent OFF impedance of switch (S11). As such, the AGC functionality is achieved without the addition of, for example, an extra attenuator and associated switches like the one shown in the representation of FIG. 1. In other words, such functionality is fulfilled through switch (S11) which is already implemented as part of the design and for the band selection function. As series switches (S21, S31) are open and shunt switches (S22, S32) are closed (while shunt switch (S12) is open instead), other bands (that are not selected to be received) coming through inputs (in2, in3) are shunted to ground and therefore are highly isolated from the input of LNA (220).

Continuing with the embodiment above, and with continued reference to FIG. 2A, when on the other hand RF receiver (200A) operates in high gain mode, switches (S11, S22, S32) are closed and switches (S21, S31) are open. As a result, the signal coming from input (in1) is routed to the input of LNA (220) without experiencing a higher resistance which is this time not required as RF receiver (200A) is in high gain mode. Similarly, in view of what was mentioned above, non-selected inputs (in2, in3) are well isolated from the LNA input, by virtue of switches (S21, S31) being open and switches (S22, S32) being closed.

With continued reference to FIG. 2A, when RF receiver (200A) is in low gain mode with signal coming from input (in1) to pass through, switch (S11) is open and switch (S12) is open. As such, the impedance seen through input (in1) by the circuits preceding switching block (210), e.g. band filters, may be undesirably impacted by the OFF impedance of switch (S11). In particular, as part of an overall receiver performance requirement, the impedance seen through input (in1) of FIG. 2A may be required to meet instead a desired value (e.g. 50 ohm) which may be substantially less than or different from the value the equivalent impedance of switch (S11) assumes when in an open state.

To address this issue, switching block (210) further comprises, in accordance with several embodiments of the present disclosure, switches (S13, S23, S33) and corresponding matching resistors (Rm1, Rm2, Rm3), a combination of which may be used for impedance matching purpose. In particular, when in low gain mode, switch (S13) may be closed, thereby putting a combination of matching resistor (Rm1) and ON resistance of switch (S13) in parallel with the rest of the circuit downstream of input (in1). The matching impedance of (Rm1) in series with the ON resistance of switch (S13) may be designed such that the input impedance seen through input (in1) would meet the input impedance requirement.

With continued reference to FIG. 2A, as an example, if the required impedance seen through input (in1) is 50 ohm (common requirement in most RF circuits), the combination of resistor (Rm1) and series resistance of switch (S13) when closed, may be selected to be close to 50 ohm as the impedance exhibited by switch (S11) when open (OFF state) is often substantially larger than 50 ohm. The person skilled in art will appreciate that, for this particular but common example where the impedance seen through input (in1) is required to be 50 ohm, the impact of adding switch (S13) and/or matching impedance (Rm1) to the design is minimal in terms of the required space on the chip and possible undesired parasitic effects, given the small value of the 50 ohm desired impedance. The disclosed architecture, results in the removal of low gain mode switches (S'1, S'2, S'3) of FIG. 1 which reduces the capacitance loading on the switch and thus the insertion loss. It also reduces the area by removing attenuator (atten). As stated, switches (S13, S23, S33) of FIG. 2A, and associated resistors can be substantially smaller than switches (S'1, S'2, S'3) as well as attenuator (atten) of FIG. 1. Referring back to FIG. 2A, when in low gain mode, switches (S23, S33) may be open. When operating in high gain mode, switches (S13, S23, S33) may stay open as the signal is directly getting to LNA (220) through switch (S11) which is closed this time. As such, the impedance seen through input (in1) is matched with the input impedance of LNA (220) usually designed to meet the impedance matching requirement.

Figure 2B:
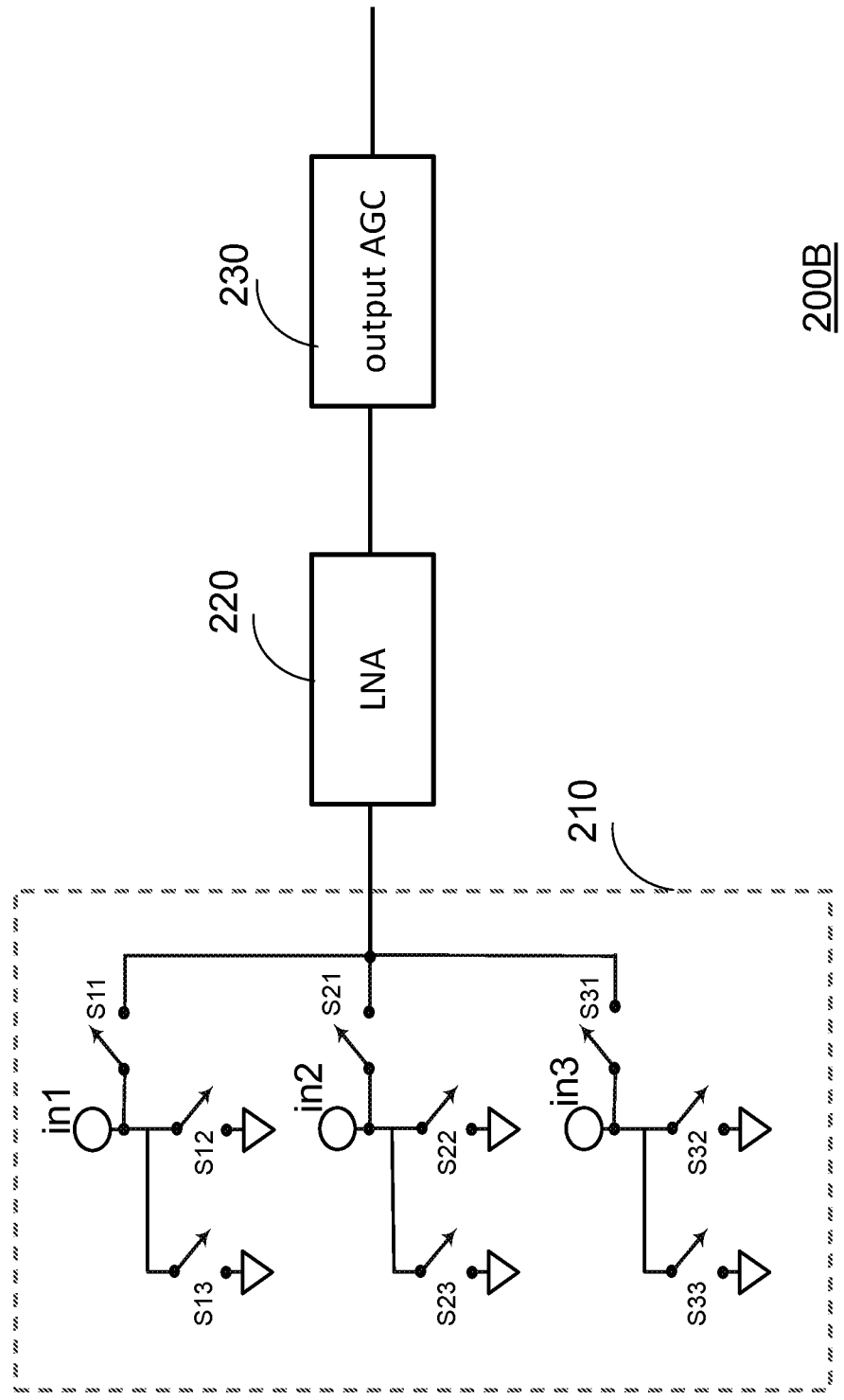
FIG. 2B shows an exemplary RF receiver according to another embodiment of the present disclosure.

FIG. 2B shows an exemplary RF receiver (200B) according to another embodiment of the present disclosure. RF receiver (200B) is similar to RF receiver (200A) both structurally and functionally, except that matching resistors (Rm1, Rm2, Rm3) are not present in RF receiver (200B) resulting in a simpler design and size reduction. As such, each of switches (S13, S23, S33) and their respective ON resistances are selected such that the equivalent impedance of the ON resistance of the switch in parallel with the rest of the circuit downstream of the corresponding RF input meets the impedance matching requirements as seen through each of the inputs (in1, in2, in3) while RF receiver (200B) is in low gain mode. It may be possible to remove switches (S11, S22, S33) and use switches (S13, S23, S33) for their functions. However, the increased resistance may translate to worse isolation from unselected inputs.

Figure 3:
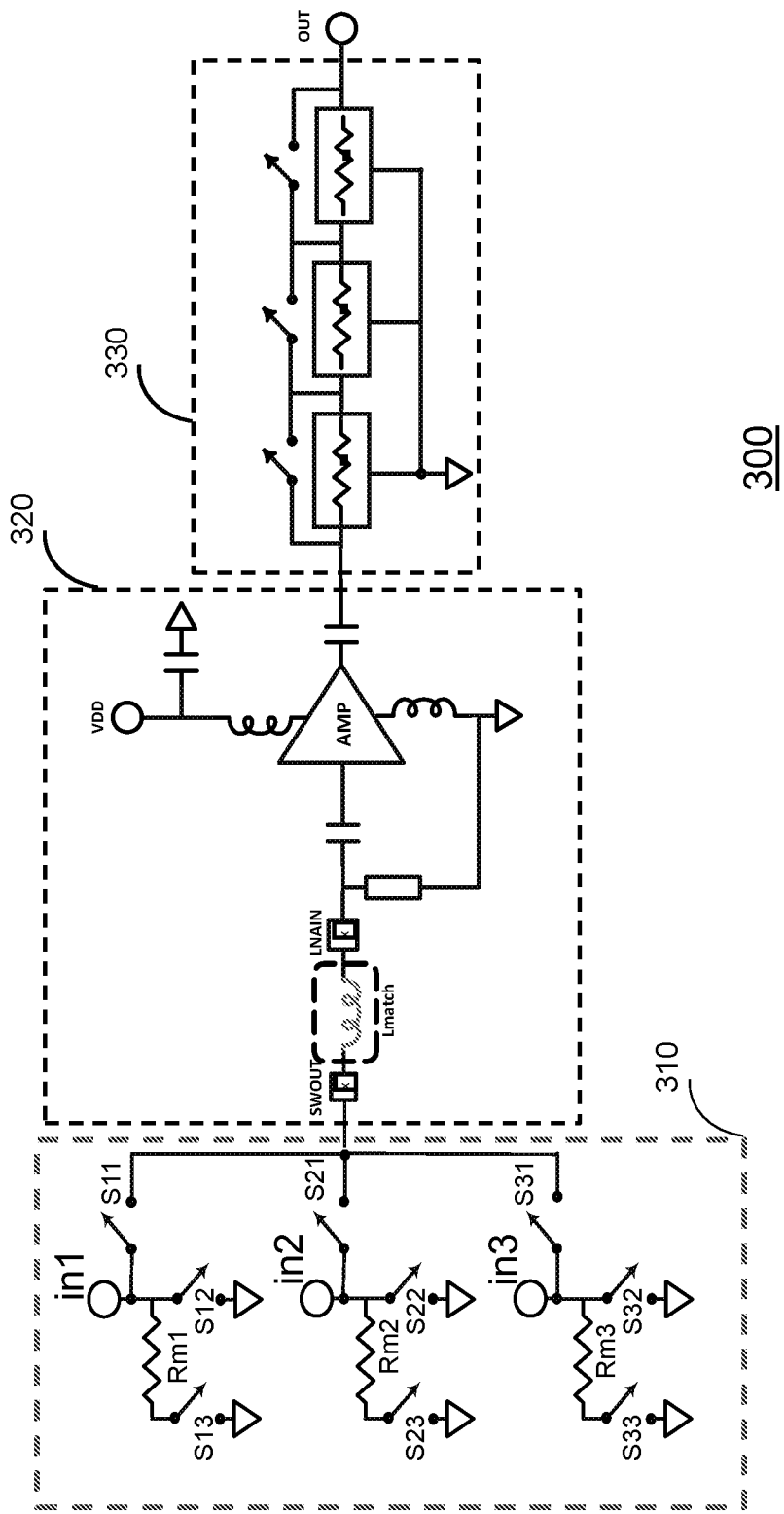
FIG. 3 shows an exemplary RF receiver according to a further embodiment of the present disclosure.

FIG. 3 shows an exemplary RF receiver (300) according to further embodiments of the present disclosure. The principle of operation of RF receiver (300) is similar to what has already been described with regards to RF receiver (200A) of FIG. 2A. Exemplary constituents of LNA (320) and output AGC (330) are shown.

Figure 4:
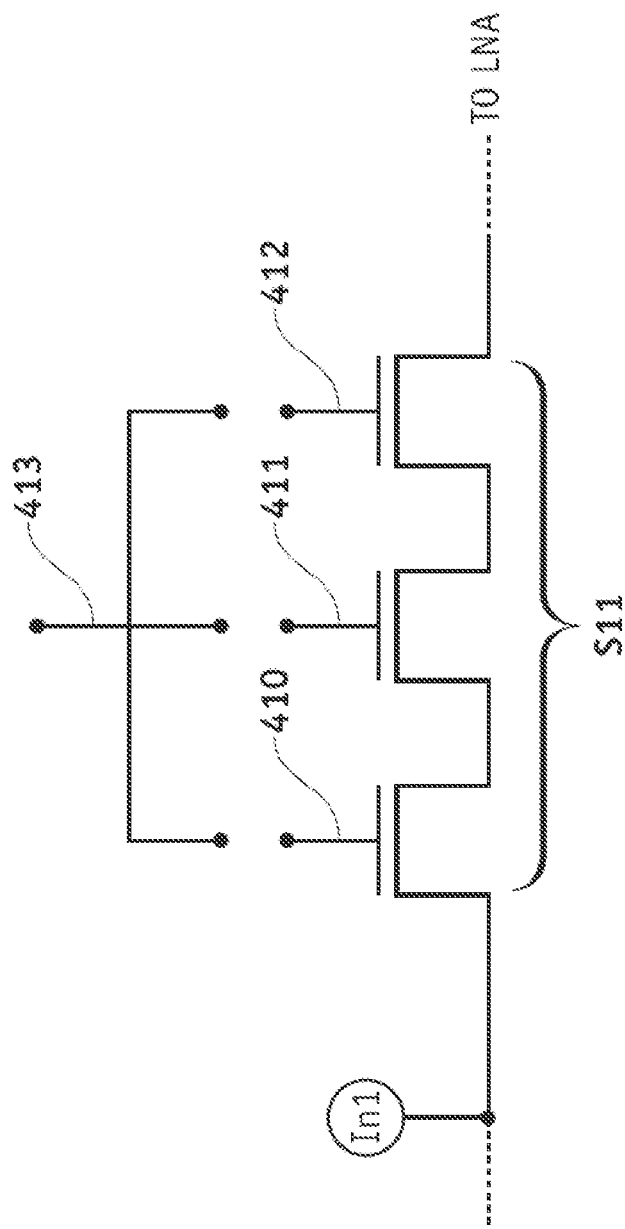
FIG. 4 shows an exemplary configuration of a switch made of a stack of transistors to be used in accordance with the present disclosure.

Various implementations of switches (S11, S21, S31) may be envisaged in accordance with the teachings of the present disclosure. In one embodiment, one or more of such switches may be implemented using a stack of transistors arranged in series (e.g. two or more transistors), as schematically shown in FIG. 4, where switch S11 is shown as stack of three transistors. The ON/OFF state of each of the transistors in the stack may be controlled using a separate control signal (410, 411, 412). As such, and when needed, one or more transistors in the stack may be controlled to be in an OFF state to achieve a desired overall OFF impedance of the stack for gain control. In other words, different numbers of series devices may be switched ON and OFF to adjust the total OFF impedance of switch (S11). To further clarify, it is known that having a stack of devices in an OFF state puts their off capacitors in series, which reduces the total effective capacitance. By selecting some of the series connected devices to be ON and some OFF, the total resistance is decreased, but also the total series capacitance is increased. Alternatively, the transistors in the stack may be controlled using a single control signal to be in ON or OFF state all at the same time. This is illustrated in FIG. 4 where the control signal may be applied to terminal (413). In another embodiment, a transistor of the stack may be implemented and controlled with a gate control voltage applied to the gate terminal of the transistor. As such, the OFF impedance of the transistor may be modulated by varying the gate bias voltage or by selecting among different bias voltage levels. Alternatively, more than one transistor, each controlled by a different gate bias control may also be envisaged. In accordance with embodiments of the present disclosure, input matching may also be adjusted by adjusting ON impedances of shunt switches (S12, S22, S32).

Implementation of the disclosed concepts may be performed in various technologies such as bulk CMOS and silicon-on-insulator (SOI). In each case, the size of the switches may be used as a design parameter to achieve the desired OFF impedance of the switch. As an example, in an SOI implementation, if the OFF transistor appears to be higher than desired, wider switches may be implemented to achieve the required OFF impedance.

Exemplary RF receivers as shown in FIGS. 2A-2B and 3, or other RF receivers according to the embodiments of the present disclosure may be implemented as part of a module, a communication device, a communication system or an integrated circuit.

Figure 5:
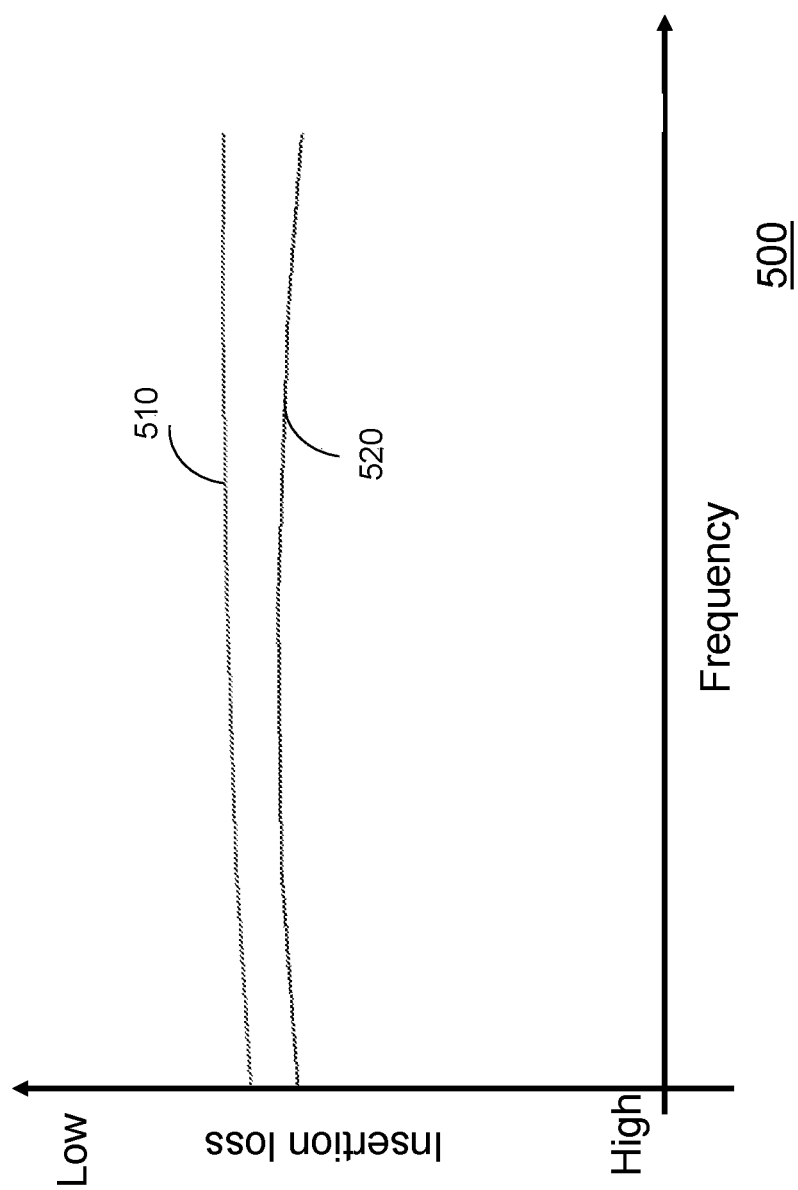
FIG. 5 shows exemplary plots of insertion loss vs. frequency according to an embodiment of the present disclosure.

FIG. 5 shows exemplary plots of insertion loss vs. frequency according to an embodiment of the present disclosure. Curves (510, 520) demonstrates the insertion losses with and without implementing the teachings of the present disclosure respectively. As can be see, the insertion loss is improved after applying the disclosed concepts. Example of improvements can be 0.1 dB or higher.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

As should be readily apparent to one of ordinary skill in the art, various embodiments of the invention can be implemented to meet a wide variety of specifications. Unless otherwise noted above, selection of suitable stack values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Stack voltage, current, and power handling capabilities may be adapted as needed, for example, by adjusting device sizes, serially "stacking" stacks (particularly FETs) to withstand greater voltages, and/or using multiple stacks in parallel to handle greater currents. Additional circuit stacks may be added to enhance the capabilities of the disclosed circuits and/or to provide additional functional without significantly altering the functionality of the disclosed circuits.

The invention claimed is:

1. A multiband radio frequency (RF) receiver circuit comprising:
  a switching block comprising a plurality of switching arrangements, each switching arrangement corresponding to a selected RF band for the multiband RF receiver circuit and being individually selectable to receive an input signal in the selected RF band, and
  a low noise amplifier (LNA) coupled to the switching block,
each switching arrangement comprising:
  an input terminal configured to receive the input signal in the selected RF band;
  a series switch configured to selectively couple the input signal at the input terminal to the LNA;
  a shunt switch configured to selectively couple the input terminal to a reference voltage when the switching arrangement is not selected, to isolate the input signal from the LNA;
wherein,
  i) when the switching arrangement is selected to couple the input signal in the selected RF band to the LNA, the shunt switch is in an OFF state to decouple the input signal from the reference voltage and:
    in a first gain mode the series switch is in an OFF state to attenuate the input signal while coupling the input signal to the LNA through an OFF impedance of the series switch, and
    in a second gain mode the series switch in an ON state to couple the input signal to the LNA through an ON impedance of the series switch; and
  ii) when the switching arrangement is not selected, the series switch is in the OFF state and the shunt switch is in the ON state.

2. The multiband RF receiver circuit of claim 1, wherein each switching arrangement further comprises an impedance matching arrangement to match an input impedance of the LNA seen through the switching arrangement, the impedance matching arrangement comprising:
  an impedance matching switch configured to couple the input terminal to a reference voltage, wherein the impedance matching switch is in an ON state in the first gain mode to provide a matching resistance through at least an ON impedance of the impedance matching switch.

3. The multiband RF receiver circuit of claim 2, wherein the impedance matching switch is in an OFF stage in the second gain mode.

4. The multiband RF receiver circuit of claim 2, wherein the impedance matching arrangement further comprises an impedance matching resistor in series with the impedance matching switch.

5. The multiband RF receiver circuit of claim 1, further comprising an automatic gain control circuit (AGC) coupled to an output of the LNA.

6. The multiband RF receiver circuit of claim 1, wherein the series switch comprises one or more transistors arranged in a stack configuration.

7. The multiband RF receiver circuit of claim 6, wherein the one or more transistors are configured to independently receive a control signal.

8. The multiband RF receiver circuit of claim 7, wherein:
  the one or more transistors are two or more transistors;
  the OFF impedance of the series switch is adjustable through the control signal independently received by the two or more transistors and by turning a first group of transistors of the two or more transistors to an OFF state and a second group of transistors of the two or more transistors to an ON state.

9. The multiband RF receiver circuit of claim 7, wherein the OFF impedance of the series switch is adjustable through the control signal independently received by the two or more transistors and by modulating OFF impedance of the two or more transistors.

10. The multiband RF receiver of claim 1, wherein an ON impedance of the shunt switch is adjustable to adjust an input matching.

11. The multiband receiver of claim 1 implemented in bulk CMOS or SOI.

12. The multiband receiver of claim 1 implemented in a module or a communication device.

13. A multiband switching block for routing a radio frequency (RF) signal to a low noise amplifier (LNA), comprising:
  a plurality of switching arrangements, each switching arrangement corresponding to a selected RF band and being individually selectable to receive an input signal in the selected RF band,
each switching arrangement comprising:
  an input terminal configured to receive the input signal in the selected RF band;
  a series switch configured to selectively couple the input signal at the input terminal to the LNA;
  a shunt switch configured to selectively couple the input terminal to a reference voltage or ground when the switching arrangement is not selected, to isolate the input signal from the LNA; wherein,
  i) when the switching arrangement is selected to couple the input signal in the selected RF band to the LNA, the shunt switch is in an OFF state to decouple the input signal from the reference voltage or ground and:

in a first gain mode the series switch is in an OFF state to attenuate the input signal while coupling the input signal to the LNA through an OFF impedance of the series switch, and in a second gain mode the series switch in an ON state to couple the input signal to the LNA through an ON impedance of the series switch; and ii) when the switching arrangement is not selected, the series switch is in the OFF state and the shunt switch is in the ON state.

14. A method of selectively coupling/decoupling a radio frequency (RF) signal to/from a low noise amplifier (LNA) through a series switch, comprising:
in a coupling stage:
in a first gain mode, setting the series switch in an OFF state and coupling the RF signal to the LNA through an OFF impedance of the series switch, and
in a second gain mode, setting the series switch in an ON state and coupling the RF signal to the LNA through an ON impedance of the series switch; and
in a decoupling stage:
in a third gain mode, setting the series switch in the OFF state and shunting the RF signal to ground.

15. The method of claim 14, wherein the RF signal has an RF band, the method further comprising:
in the coupling stage, selecting the series switch from a plurality of series switches, based on the RF band.

16. The method of claim 14, further comprising:
in the first gain mode, adjusting an input impedance of the LNA.

\* \* \* \* \*